(12) United States Patent
Speier

(10) Patent No.: US 10,048,346 B2
(45) Date of Patent: Aug. 14, 2018

(54) METHOD AND DEVICE FOR CONTROLLING A MAGNETIC RESONANCE IMAGING SYSTEM

(71) Applicant: Siemens Aktiengesellschaft, Munich (DE)

(72) Inventor: Peter Speier, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 704 days.

(21) Appl. No.: 14/618,433

(22) Filed: Feb. 10, 2015

(65) Prior Publication Data
US 2015/0226823 A1    Aug. 13, 2015

(30) Foreign Application Priority Data
Feb. 10, 2014 (DE) .................. 10 2014 202 358

(51) Int. Cl.
*G01V 3/00*      (2006.01)
*G01R 33/565*      (2006.01)
(Continued)

(52) U.S. Cl.
CPC . *G01R 33/56518* (2013.01); *G01R 33/34092* (2013.01); *G01R 33/443* (2013.01);
(Continued)

(58) Field of Classification Search
CPC ............. G01R 33/543; G01R 33/5659; G01R 33/3415; G01R 33/36; A61B 5/055
(Continued)

(56) References Cited

U.S. PATENT DOCUMENTS

| | | |
|---|---|---|
| 2005/0258829 A1 | 11/2005 | Bieri et al. |
| 2006/0001424 A1 | 1/2006 | Harvey et al. |

(Continued)

FOREIGN PATENT DOCUMENTS

| | | |
|---|---|---|
| CN | 101162262 A | 4/2008 |
| WO | WO-2004/099809 A1 | 11/2004 |

OTHER PUBLICATIONS

Oppelt et al., "FISP: eine neue schnelle Puls-sequenz für die Kernspintomographie," electromedica, vol. 54, Issue 1 (1986), pp. 15-18.
(Continued)

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

In a magnetic resonance apparatus and a method for the operation thereof, a pulse sequence is employed that is composed of a number of pulse sequence segments, each including an excitation procedure and a readout procedure. For each of a number of slices of an examination subject that are to be simultaneously excited, the pulse sequence segment is repeated, as a pulse sequence segment pair, with a prephasing gradient pulse being generated between the respective excitations in the respective segments of the pair. The prephasing gradient is configured to cause a gradient moment for all gradients between the respective centers of the respective excitations to be zero. The respective rephasing gradient pulses in each pair of segments are similar, and the respective excitation pulses have different phases.

13 Claims, 3 Drawing Sheets

(51) Int. Cl.
*G01R 33/34* (2006.01)
*G01R 33/44* (2006.01)
*G01R 33/54* (2006.01)
*G01R 33/561* (2006.01)
*G01R 33/483* (2006.01)

(52) U.S. Cl.
CPC ....... *G01R 33/4835* (2013.01); *G01R 33/543* (2013.01); *G01R 33/546* (2013.01); *G01R 33/5612* (2013.01); *G01R 33/5614* (2013.01); *G01R 33/5611* (2013.01)

(58) Field of Classification Search
USPC ........................................................ 324/309
See application file for complete search history.

(56) References Cited

U.S. PATENT DOCUMENTS

| | | | |
|---|---|---|---|
| 2007/0106150 A1 | 5/2007 | Greiser et al. | |
| 2011/0006768 A1* | 1/2011 | Ying | G01R 33/5611 324/309 |
| 2011/0254548 A1* | 10/2011 | Setsompop | G01R 33/4835 324/309 |
| 2012/0235684 A1 | 9/2012 | Stemmer | |
| 2012/0319686 A1 | 12/2012 | Jesmanowicz et al. | |
| 2013/0057281 A1 | 3/2013 | Feiweier | |
| 2013/0099784 A1* | 4/2013 | Setsompop | G01R 33/54 324/309 |
| 2013/0113483 A1* | 5/2013 | Park | G01R 33/4828 324/309 |
| 2013/0271128 A1* | 10/2013 | Duerk | G01R 33/5611 324/307 |
| 2013/0285656 A1 | 10/2013 | Feiweier | |

OTHER PUBLICATIONS

Breuer et al., "General Formulation for Quantitative G-factor Calculation in GRAPPA Reconstructions," Magnetic Resonance in Medicine, vol. 62 (2009), pp. 739-746.
Bieri et al., "Analysis and Compensation of Eddy Currents in Balanced SSFP," Magnetic Resonance in Medicine, vol. 54 (2005), pp. 129-137.
Breuer et al., "Controlled Aliasing in Parallel Imaging Results in Higher Acceleration (CAIPIRINHA) for Multi-Slice Imaging," Magnetic Resonance in Medicine, vol. 53 (2005), pp. 684-691.
Stäb et al., "CAIPIRINHA Accelerated SSFP Imaging," Magnetic Resonance in Medicine, vol. 65 (2011), pp. 157-164.
Yutzy et al., "Improvements in Multislice Parallel Imaging Using Radial CAIPIRINHA," Magnetic Resonance in Medicine, vol. 65 (2011), pp. 1630-1637.
Stäb et al., "Mit CAIPIRINHA beschleunigte Mehrschicht-TrueFISP-MR-Herzperfusionsbildgebung mit vollständiger Herzabdeckung," Fortschr Röntgenstr, vol. 181 (2009).
Stäb et al., "CAIPIRINHA accelerated simultaneous multi-slice TrueFISP real-time imaging," Proc. Intl. Soc. Mag. Reson. Med., vol. 17 (2009) p. 2659.
Zhou et al., "Artifact-Reduced Two-Dimensional Cine Steady State Free Precession for Myocardial Blood-Oxygen-Level-Dependent Imaging," Journal of Magnetic Resonance Imaging, vol. 31 (2010), pp. 863-871.

* cited by examiner

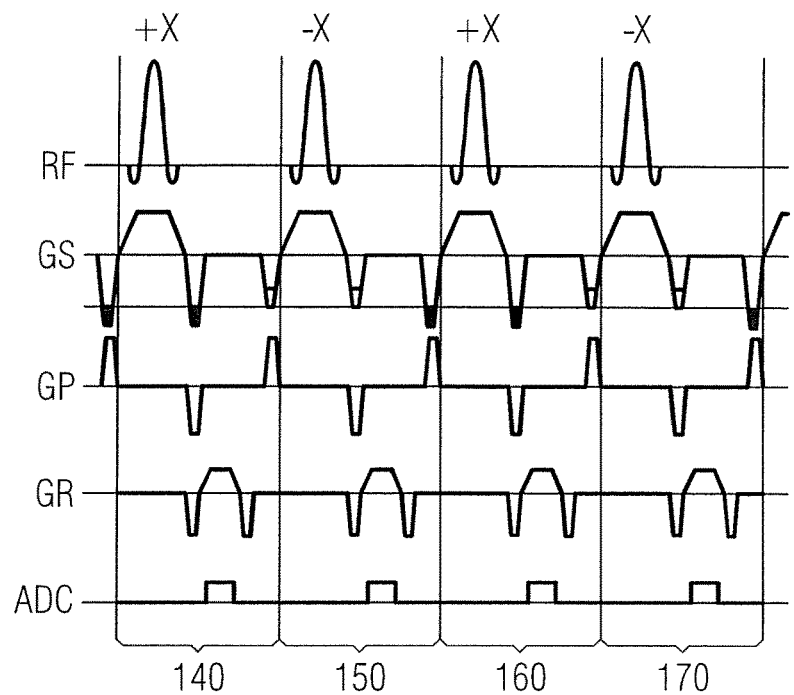
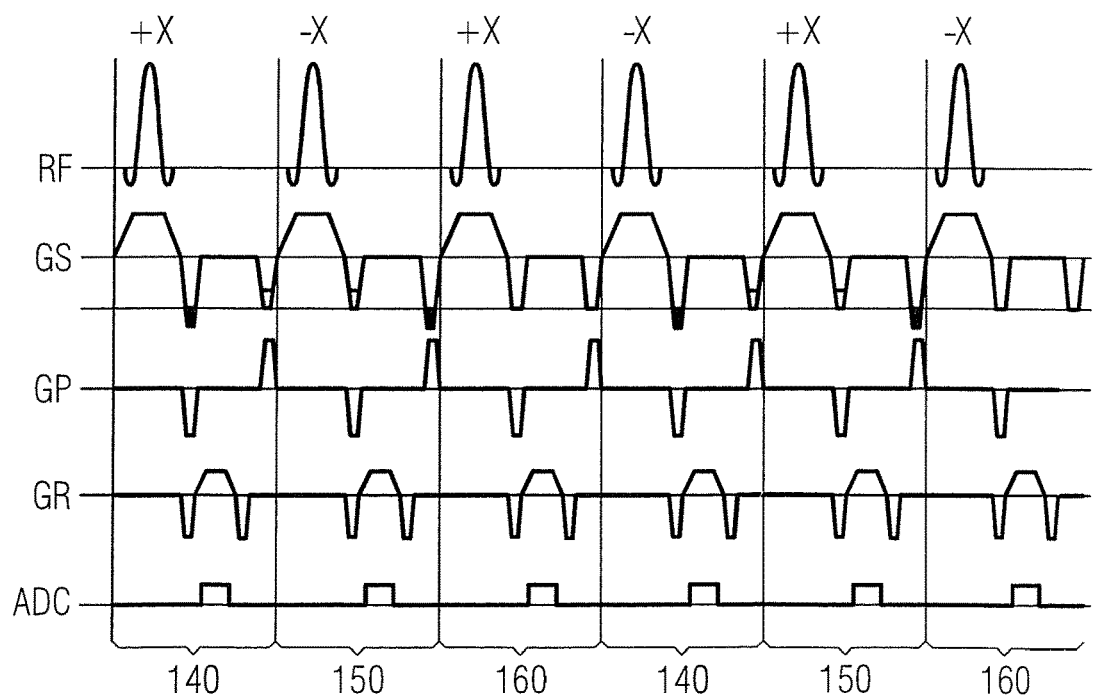

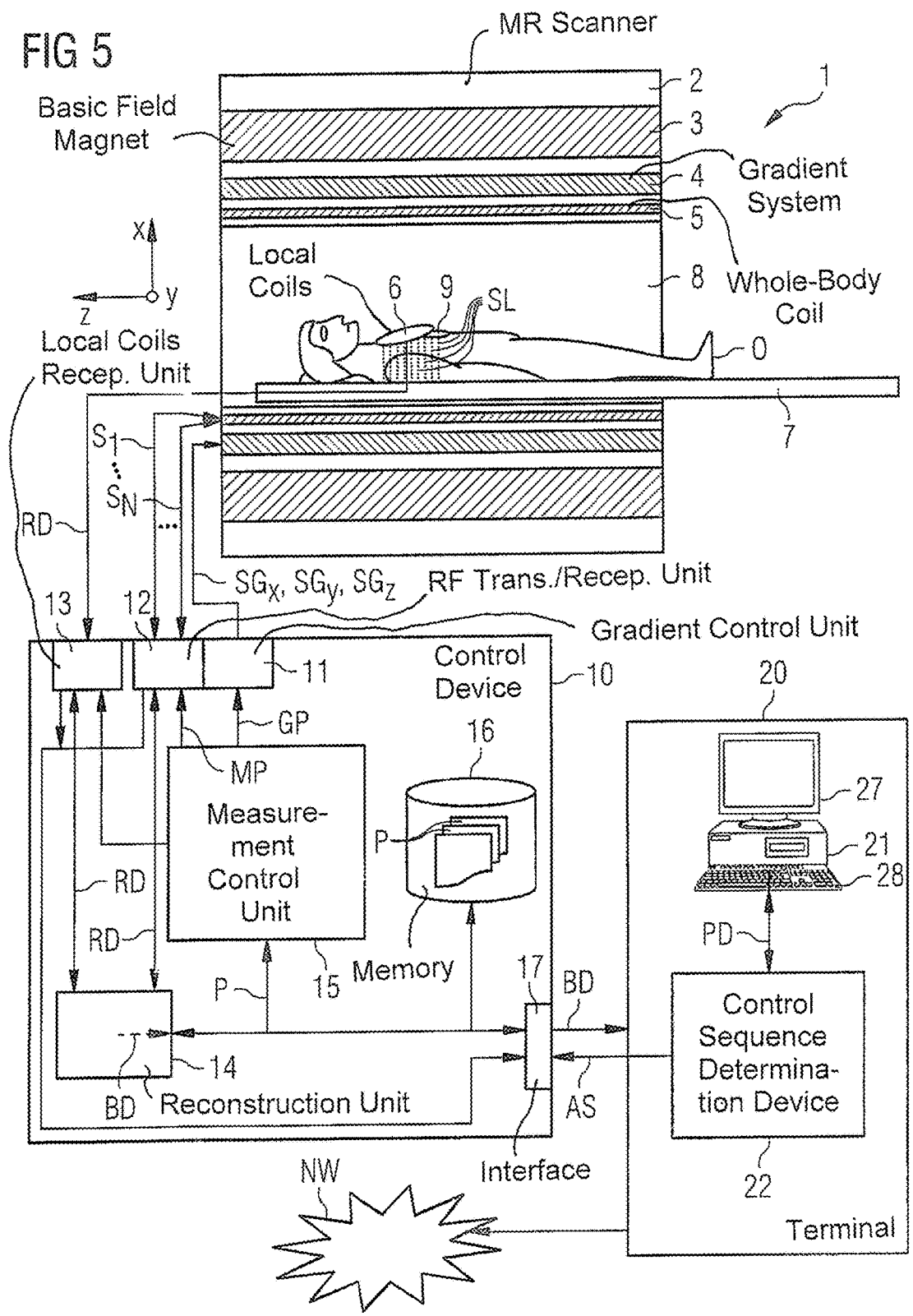

METHOD AND DEVICE FOR CONTROLLING A MAGNETIC RESONANCE IMAGING SYSTEM

BACKGROUND OF THE INVENTION

Field of the Invention

The invention relates to a method for controlling a magnetic resonance imaging system for the generation of magnetic resonance image data relating to an examination object, wherein magnetic resonance raw data are acquired. The invention also concerns a magnetic resonance system that is operated according to such a method.

Description of the Prior Art

For the acquisition of magnetic resonance raw data, it is known to use multiple pulse sequence segments, each involving one excitation procedure and a subsequent read-out procedure. In the excitation procedure, a first slice selection gradient pulse is generated in the slice selection direction. In addition, an RF excitation pulse is generated, which encompasses N corresponding excitation frequencies for the excitation of N slices that are to be excited simultaneously. In the subsequent read out procedure, a rephasing gradient pulse is generated in the slice selection direction and RF signals for the acquisition of magnetic resonance raw data are received. After receiving RF signals for a preceding pulse sequence segment and before generating the RF excitation pulse for a subsequent pulse sequence segment, a prephasing gradient pulse is generated in the slice selection direction, which pulse is designed such that the gradient moment across all the gradient pulses in the slice selection direction, integrated from the center of an RF excitation pulse to the center of a subsequent RF excitation pulse, has the value 0.

In other words, it is an essential condition for a steady phase of freely precessing spins (steady-state free precession SSFP) that the gradient pulses in the slice selection direction, AS WELL AS and also in the other two directions, are balanced.

Magnetic resonance imaging systems (magnetic resonance tomography systems) are established and proven for a wide range of applications. In this type of image acquisition, a static basic magnetic field B0 that is used for initial alignment and homogenization of the magnetic dipoles nuclei to be studied is superimposed on a rapidly connected magnetic field, known as the gradient field, for local resolution of the image-generating signal. In order to determine the material properties of an examination object that is to be mapped, the dephasing or relaxation time is determined after deflection of the magnetization from the initial direction, such that various material-specific relaxation mechanisms or relaxation times can be identified. Deflection is generally achieved using a number of RF pulses and the local resolution depends on a timed manipulation of the deflected magnetization with the use of the gradient field in a "test sequence" or "control sequence", which sets a precise timed sequence consisting of RF pulses, modification of the gradient field (by transmitting a switching sequence of gradient pulses), and acquisition of test values.

Typically, a correlation between measured magnetization—from which the aforementioned material properties can be derived—and a local co-ordinate of the measured magnetization in the spatial domain, in which the examination object is arranged, is achieved with the use of an intermediate step. In this intermediate step, acquired magnetic resonance raw data are entered at read-out points in an electronic memory organized as k-space. The co-ordinates of k-space being coded as a function of the gradient field. The contribution made by magnetization (in particular by transverse magnetization, determined in a plane transverse to the aforementioned basic magnetic field) at a particular place on the examination object, can be determined from the data for the read-out point by a Fourier transform that calculates the signal strength of the signal in the local space from a signal strength (contribution made by magnetization) that is assigned to a specific frequency (the local frequency) or phase position.

Magnetic resonance tomography is a relatively slow type of imaging method since the data are recorded sequentially along lines in Fourier space or in k-space, and a certain minimum time is required for the spin relaxation of the excited spins. The method of recording images in two-dimensional slices is clearly less prone to error than recording in three dimensions because the number of coding steps is lower than in a three-dimensional method. Therefore, in many applications, image volumes formed as stacks of two-dimensional slices are used instead of one single three-dimensional image. Even so, the image recording times are very long due to the long relaxation times for the spins, which means, for example, a reduction in comfort for patients who need to be examined. In addition, patients cannot leave the magnetic resonance tomography unit for a short time during the recording of the image or even just change their position since this would ruin the imaging procedure due to the change in position and the whole process would have to start again from the beginning. Consequently, it is an important objective to accelerate the recording of two-dimensional slice stacks.

To accelerate imaging, parallel imaging techniques are used, for example. In some of the imaging techniques, artifacts may occur due to undersampling. These artifacts can be eliminated by using reconstruction algorithms. A further option for the elimination of the artifacts involves the use of CAIPIRINHA (Controlled aliasing in parallel imaging results in higher acceleration, as described in the article BREUER, FELIX A. ET AL., "Controlled aliasing in parallel imaging results in higher acceleration (CAIPIRINHA) for multi-slice imaging", in: Magnetic Resonance in Medicine, 2005, Vol. 53, No. 3, pp. 684-691, DOI 10.1002/mrm.20401. CAIPIRINHA modifies the artifacts that occur in order to improve the subsequent image reconstruction. CAIPRINHA is therefore superior to some other parallel imaging concepts, in which there is only one subsequent post-processing stage for images impaired by artifacts. In CAIPIRINHA, a number of slices of any thickness and any distance apart are excited simultaneously using multiband RF pulses. The data of the respective slices are then individually sampled, generating images with superimposed slices that are offset from one another. The offset between the slices can be generated by modulation of the phase for the individual slices in the multiband RF pulse.

One technique for rapid image-generation with a high signal-to-noise ratio is TrueFISP (True Fast Imaging with Steady State Precession), also known as Trufi or bSSFP (balanced free precession), as described in OPPELT A. ET AL., "FISP: eine neue schnelle pulse sequence für die Kernspintomographie" [a new rapid pulse sequence for nuclear spin tomography], in: electromedica, Vol. 54, 1986, Issue 1, pp. 15-18. A coherent image recording technique is applied here in which a balanced gradient pulse form is used. A technique is used involving a balanced state in a steady balance with freely precessing spins. TrueFISP functions particularly well with balanced gradient moments and short repetition times TR, it being possible due to the short repetition times to reduce the banding artifacts caused by $B_0$-inhomogeneities in the recorded images. Although True-FISP is a rapid imaging method, there is a need for even faster imaging. For example, real time images can be improved by faster imaging methods. It is also possible to improve the comfort of examination subjects who cannot hold their breath for very long or cannot move. It is therefore a good idea to combine TrueFISP with parallel image sensing, in which multiple slices are scanned simultaneously. However, the repetition times in conventional TrueFISP are so short that gradient activity occurs at all points in time. Therefore, TrueFISP sequences cannot be nested in order to record a plurality of sub-sampled slices simultaneously. The parallel imaging may be limited due to the requirement for the steady state of the freely precessing spins. During the reduction of the phase-coded lines, however, as is the case with CAIPIRINHA, and the recording of slices with a small distance between them, the signal-to-noise-ratio may be significantly worsened. When using the conventional CAIPIRINHA, the robustness of the TrueFISP sequence in withstanding $B_0$-inhomogenitities may be reduced, due to the use of phase-modulated RF pulses with which a number of slices are excited (see STÄB D. ET AL., "Mit CAIPIRINHA beschleunigte Mehrschicht-TrueFISP-MR-Herzperfusionsbildgebung mit vollstandiger Herzabdeckung" [Multilayer TrueFSIP-MR-Heart perfusion imaging accelerated with CAIPIRINHA and covering the heart completely], in: Fortschr Röntgenstr 2009; 181: VO319_6, DOI: 10.1055/s-0029-1221517), as a result of which changes in the signal and contrast and an increased number of banding artifacts may occur.

US 2013/0271128 describes a method with which a simultaneous acquisition of multiple of slices is achieved using the SSFP technique (SSFP=steady state free precession=Trufi), wherein, however, the different phases of the excited spins in the different slices are no longer generated by modulation of the RF pulse, but by variation, of the gradient pulses, that is. To be more precise, the rephasing gradient pulses used within the TrueFISP method and assigned to the individual slices are cyclically modified (for example, their amplitude is modified), such that different phases are imprinted on the freely precessing spins of different slices, without contrast changes occurring due to the phase modulation of the RF pulses that is used in the conventional CAIPIRINHA method. The method described in US 2013/0271128 is also known as multi-slice blipped TrueFISP-CAIPIRINHA (TRUEFISP-CAIPIRINHA with tagged slices). In the particularly effective variant bSSFP (balanced steady state free precession, corresponding to the method described in US 2013/0271128), interference or artifacts may easily occur due to inhomogeneities of magnetic fields and also to eddy currents. In particular, if the simultaneously recorded slices are spaced very close together, an impairment of the image quality occurs in SSFP-SAMS images (SAMS=simultaneous acquisition of multiple slices). For example, a considerable impairment of the image quality occurs if, within the parameters or boundary conditions that are typical of clinical applications, the ratio between the distance between the center of the respective slices and the slice thickness of the relevant slices is lower than 2. The reason for these artifacts is the marked change in the slice prephasers and rephasers that is necessary in order to achieve an adequate phase change between the closely adjacent slices. This marked change leads to more marked eddy currents. In the method disclosed in US 2013/0271128, because the phase of the freely precessing spins is inverted in each read-out step, in parallel with the Trufi-RF phase (Trufi=true fast imaging with steady precession), when the prephasers and rephasers are changed, the eddy current effects are increased and the steady Trufi-state is impaired. This leads to dephasing of the phase-coded spins, resulting in interference and artifacts in the reconstructed image.

Conventionally, the aforementioned problems could be alleviated only by ensuring that a minimum distance was maintained between the individual slices to be scanned. This means, however, that one is restricted to applications involving large gaps between the slices.

The problem therefore exists of achieving simultaneous imaging of parallel adjacent slices with as few artifacts as possible.

SUMMARY OF THE INVENTION

This problem is solved by a method for the control of a magnetic resonance imaging system and by a magnetic resonance imaging system according to the invention.

In the method according to the invention, the pulse sequence segments for the N respective simultaneously excited slices having different rephasing gradient pulses is repeated and a pair of pulse sequence segments with similar rephasing gradient pulses, but having RF excitation pulses with different phases, is generated for each simultaneously excited slice. This method is based on the concept of "pairing" described in US 2005/0258829 and used to suppress eddy currents where there are large phase coding jumps in TrueFISP.

The eddy currents generated by the rephasing gradient pulses are at least partly compensated by the repetition of the respective pulse sequence segment with an RF excitation pulse having a different phase, such that overall no magnetic interference field that could impair the steady state of the freely precessing spins (SSFP=steady state free precession) or only a slight interference field is generated. For example, the phase of the RF excitation pulse during the repetition of the pulse sequence segment according to the invention can change from +180° to −180°. The phase change in the RF excitation pulse is taken into account in the read-out or filtering out of the carrier signal in the signal evaluation by the corresponding alteration of the phase of the reference pulse. Furthermore, where there are two slices for example, the phase generated by the rephasing gradient pulses, which is uniform for the respective individual slice, of the precessing spins can be 0° and 180°, and where there are three slices, it can be 120°, −120° and 0°. Since the respective pulse sequence segments according to the invention are repeated, the rephasing gradient pulse sequences remaining unchanged in the respective repetition, this results in a pulse sequence series with rephasing gradient pulses, to which the following phases are assigned in the aforementioned example: where there are two slices, they are (0°, 0°, 180°, 180°), where there are three slices, they are (120°, 120°, −120°, −120°, 0°, 0°). In this context, similar rephasing gradient pulses are rephasing gradient pulses for which the phase difference thereof is ≪180°. The phase difference are preferably a maximum of 90°. If the phase difference assigned to the consecutive rephasing gradient pulses is 90°, then the reconstruction of the image data from the read-out signals that contain the image data relating to a number of slices in the form of superimposed signals is particularly simple. A phase difference of <45° is also particularly preferable. Expressed in general terms, in the case of n slices, the phases are k•360°/N, where k=0, . . . N−1. In limiting cases, the phase difference would be 360°/(2N). Particularly preferable is a phase difference of 360°/(4N).

The control sequence according to the invention includes pulse sequence segments for the N slices to be excited simultaneously that have different rephasing gradient pulses, with a pair of pulse sequence segments with similar rephasing gradient pulses, but having RF excitation pulses with different phases, being arranged consecutively.

The control sequence-determination system according to the invention is designed to determine a control sequence for the magnetic resonance imaging system according to the invention.

The magnetic resonance imaging system according to the invention includes a control device that is designed to control the magnetic resonance imaging system using the method according to the invention. The control device preferably includes a control sequence determination system according to the invention.

In a preferred variant of the method, the rephasing gradient pulses in a pair of pulse sequence segments are equal. This allows optimum compensation of the eddy currents generated by the rephasing gradient pulses and hence imaging that is particularly free from artifacts.

In a particularly useful variant of the method, a gradient pulse is enabled in a plane transverse to the slice selection direction, simultaneous with the rephasing gradient pulse. In this case all the gradients have to be balanced, that is, the integral of the gradient pulse trains on each axis over each pulse sequence segment must be zero.

In a particularly advantageous variant of the method, a pair of pulse sequence segments includes different gradient pulses that are enabled in at least one plane transverse to the slice selection direction. Therefore, although the slice selection gradient and the rephasing gradient pulse remain essentially unchanged during the repetition of the pulse sequence segments according to the invention, the gradient pulses enabled transverse to the slice selection direction are changed, however, such that additional image data is acquired during the repetition. This procedure allows a reduction in the number of sampling pulses and thus makes it possible to reduce the total sampling time for an examination object.

An alternative variant of the method includes undersampling of k-space. This can be achieved by, for example, having arranged round the area that is to be examined a plurality of excitation coils and receiving antennas, with which a wide-meshed sampling of k-space is carried out in each case, and which individually in themselves would fail to satisfy the Nyquist-Shannon theorem in each case. The image data acquired by the individual coils would therefore separately result in images impaired by artifacts. However, from an analysis of the data acquired from all the excitation antennas and receiving antennas, it is possible to obtain an image that no longer contains the interfering artifacts. The procedure described has applications in, for example, image acquisition methods with the acronyms GRAPPA, SENSE and CAIPIRINHA.

According to an alternative variant, the method includes Cartesian sampling of k-space. This can be advantageous, for example, depending on the geometry of the area to be examined.

According to an alternative variant, the method includes radial sampling of k-space.

It is also possible to combine the two different sampling styles and to combine different sampling styles during imaging.

According to a different variant, the method includes randomly controlled sampling of k-space.

In the last-mentioned method, particularly strong eddy currents occur due to the marked change in the k-vector in most of the sampling cycles, leading to corresponding artifacts. These can likewise be compensated for by a repetition of the individual sampling cycles, in a similar manner to the method used according to the invention.

In an alternative variant of the method, a cine-recording method is used. With this special method, it is possible to record moving objects. To do this, the test sequence is repeated a plurality of times with complete or sub-sampled k-space coding. A series of images is reconstructed from the repetitions. The k-space coding can be varied from repetition to repetition.

In a variant of the method that can be achieved with a particularly good result, the number N of slices to be read out simultaneously is equal to 2.

Alternatively, the number N of slices to be read out simultaneously can also be equal to 3. Basically, the optimum would be to read out as many slices as possible simultaneously. However, the number of slices to be read out simultaneously is limited by the following circumstances: the energy supplied to the patient per pulse is proportional to the number of slices N, yet the permitted energy input per time is limited. Moreover, the separation in the image reconstruction becomes increasingly difficult, the more slices are read out simultaneously, since the noise in the separated images increases. This increase is not linear. Therefore, in practice, it is only possible to read out a few slices simultaneously.

BRIEF DESCRIPTION OF THE DRAWINGS

FIG. 1 is a graph that shows a series of pulse sequences in an imaging method for the simultaneous recording of 2 slices according to the prior art.

FIG. 2 is a graph that shows a series of pulse sequences in an imaging method for the simultaneous recording of 3 slices according to the prior art.

DESCRIPTION OF THE PREFERRED EMBODIMENTS

Figure 3:
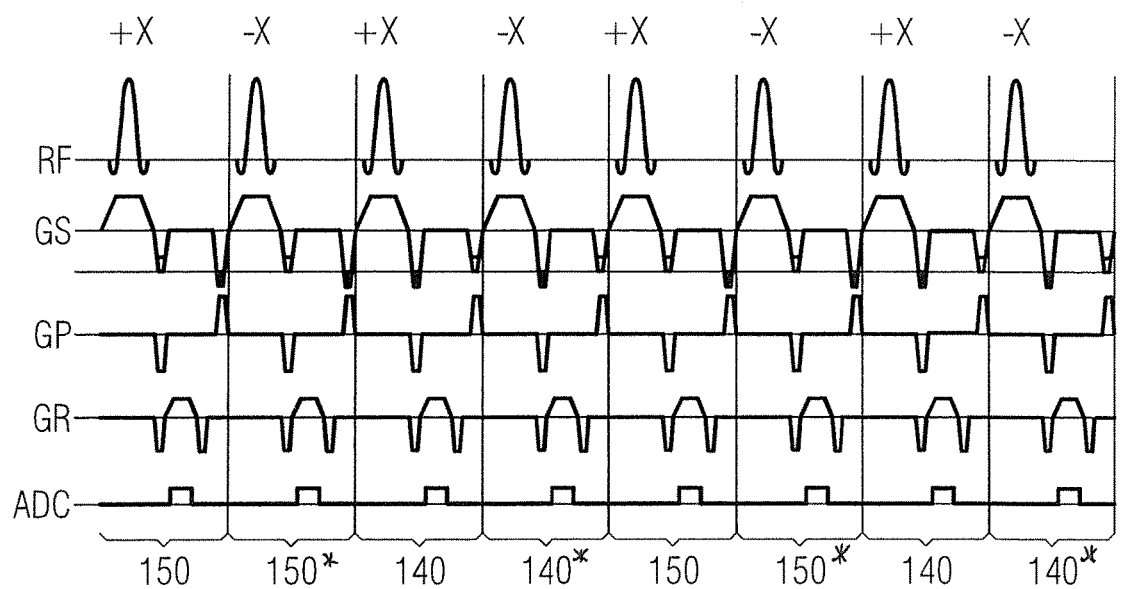
FIG. 3 is a graph that shows a pulse sequence series in an imaging method according to a first embodiment of the invention, for two slices.

FIG. 1 shows a pulse sequence diagram of a multi-slice blipped TrueFISP CAIPIRINHA recording method (also known as SSFP-SAMS=steady state free processing simultaneous acquisition of multiple slices), in which the pulse sequence or pulse series is shown for four repetition times TR or repetition intervals RI 140, 150, 160 and 170. Each of the repetition intervals has assigned to it an RF pulse, the phase of which changes from interval RI to interval RI from +(shown in FIG. 1 as +X) to −(shown in FIG. 1 as −X) or from +180° to −180°. Furthermore, each interval RI includes a gradient pulse sequence GS in the slice selection direction. This consists, occurring chronologically, of the actual slice selection gradient and of a prephaser and a rephaser. In this case, two slices are excited simultaneously. In each of the repetition intervals, an amount is subtracted from the phase coding gradient (rephaser) or an amount is added to the phase coding gradient. For balancing, so that the steady state of the freely precessing spins can be maintained, a prephaser has to be generated to conclude the respective repetition time, which prephaser is modified such that it balances out the modification of the rephaser, so that the gradient moment across the entire repetition time is 0. Consequently, an amplitude value is deducted from the prephaser, for example, if an amplitude value has been added to the respective rephaser, as can be seen, for example, in the repetition interval 140. As a result of the modification of the rephaser in the repetition interval 140, a phase assigned to the first slice, for example +90°, and a phase assigned to the second slice, of −90°, is imposed on the freely precessing spins in the first slice of the two slices that are to be excited simultaneously. In the repetition interval 150, a phase of the freely precessing spins in the first slice that is different from the phase of the freely precessing spins in the first slice, for example −90°, and a phase assigned to the second slice, of +90°, is now generated, yet no amplitude value is added in the respective rephaser in the repetition interval 150, but an amplitude value is deducted instead. However, to balance things out, an amplitude value has to be added to the prephaser in the repetition interval 150 so that the gradient moment across the entire repetition interval is again equal to 0. The phase imprint on the spins in the slices, also known as phase coding PE, makes it possible to assign simultaneously recorded image data for the two slices to the individual slices. Furthermore, gradient pulses GR and GP are drawn in FIG. 1 perpendicular to the slice selection gradient GS, with the aid of which pulses two-dimensional coding of the area to be examined is facilitated. Finally, the bottom line of the diagram shows an ADC rectangular pulse, with which a readout window for reading out the image data signal is generated. In the subsequent repetition intervals 160 and 170, the procedure of phase-coding the two simultaneously excited slices is repeated. However, the gradient pulses GR or GP, for example, change so that a different k-space line is scanned. If the simultaneously excited slices are fairly close together, however, the rephasers will differ all the more strongly from repetition interval to repetition interval. The eddy currents generated by the individual rephaser gradient pulses produce interfering magnetic fields that lead to dephasing of the spins in the individual slices and hence to interference with the steady state of the freely precessing spins (SSFP state). The strength of the interfering magnetic fields depends here on the extent of the modification of the rephasing gradient pulses assigned to the individual slices. The extent of the aforementioned modification of the rephasing gradient pulses that is required depends, however, as already stated, on the gap between the adjacent slices that are to be excited simultaneously. If the gaps between the slices are too small, then artifacts appear during imaging, meaning impairment of the quality of the imaging process.

FIG. 2 shows a pulse sequence diagram similar to the diagram in FIG. 1, in which, however, three slices are now scanned simultaneously instead of two slices. The repetition intervals 140, 150, 160 are assigned to the three slices. The rephasers assigned to the respective repetition intervals differ with respect to their amplitude, so that different phases can be assigned to the freely precessing spins in the three different slices. Here, an amplitude value is added to the rephaser that is delineated in the repetition interval 140, which corresponds, for example, to a phase of the spins that are precessing freely in the first slice of +120°, to a phase of 0° assigned to the second slice and a phase of +240° assigned to the third slice. An amplitude value is subtracted from the rephaser delineated in the repetition interval 150, which corresponds, for example, to a phase of the freely precessing spins in the first slice of 0°, of the freely precessing spins in the second slice of 0° and of the freely precessing spins in the third slice of 0°. On the other hand, the prephaser delineated in the repetition interval 160 is unmodified, which, for example, corresponds to a phase of the freely precessing spins in the first slice of 240°, of the freely precessing spins in the second slice of 0° and of the freely precessing spins in the third slice of 120°. In the subsequent repetition intervals 140, 150, 160, the procedure of phase coding the three simultaneously excited slices is repeated. However, the gradient pulses GR or GP, for example, change so that a different k-space line is now scanned.

FIG. 3 shows a pulse sequence diagram of a multi-slice MR data acquisition method according to a first embodiment of the invention (also known as paired SSFP-SAMS or as paired multi-slice blipped TrueFISP-CAIPIRINHA), two slices being excited simultaneously in FIG. 3. Unlike the method used in FIG. 1, however, in the method according to the first embodiment of the invention the repetition intervals 140 and 150 are repeated with an inverted excitation pulse RF (that is, for example, x, or −180°, +x, or)+180°) as repetition intervals 140* or 150*. This procedure is also known as pairing. Here, due to the retention of the rephasers or of the phases of the spins assigned to the rephasers in the first and second slice in the transition from repetition interval 140 to repetition interval 140*, the phase of the excitation pulse RF being inverted, however, there results in a counter-directional interference field, which just compensates for the interference field generated in the repetition interval 140 or, expressed in more general terms, at least partly reduces it. The repetition interval 150 corresponds to the repetition interval 150 shown in FIG. 1. This is now repeated by the repetition interval 150*, the phase of the excitation pulse RF again being inverted in order to compensate for the interference field generated in the repetition interval 150. In the subsequent repetition intervals **140, 140*, 150, 150*, the procedure of phase coding of the two simultaneously excited slices and of the pairing described is repeated, but the gradient pulses GR or GP, for example, change so that a different k-space line is now scanned. For the simultaneous excitation of two slices with the repetition intervals 140, 140*, 150, 150* shown in FIG. 3**, the result is, for example, a sequence of the excited spins of (0°, 0°, 180°, 180°) that have been assigned to the prephasers.

Figure 4:
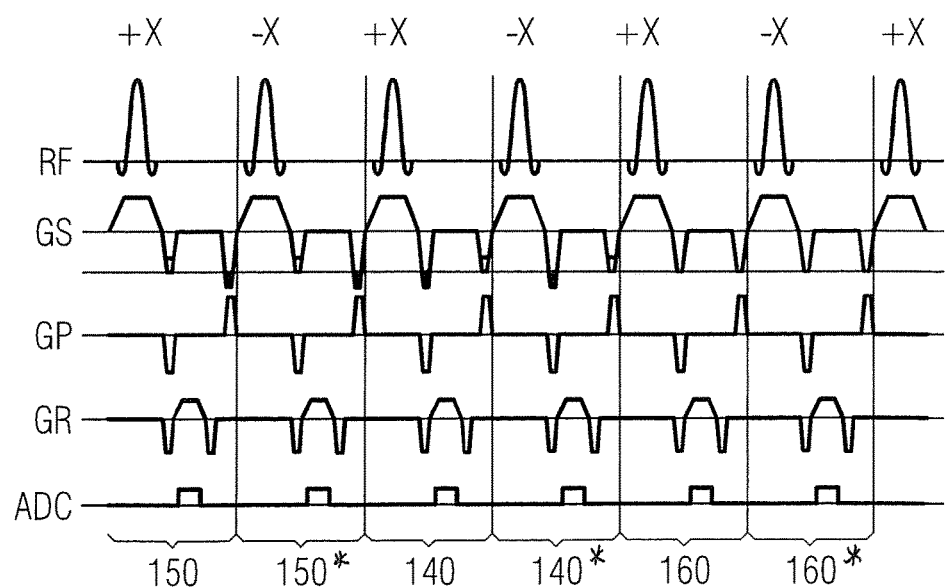
FIG. 4 is a graph that shows a pulse sequence series in an imaging method according to a second embodiment of the invention, for three slices, FIG. 5 schematically illustrates a magnetic resonance imaging system according to an embodiment of the invention.

FIG. 4 shows a pulse sequence diagram of a multi-slice recording method according to a second embodiment of the invention, three slices being excited simultaneously in FIG. 4. Unlike the method used in FIG. 2, in the method according to the second embodiment of the invention, however, the repetition intervals 140, 150 and 160 are repeated with an inverted excitation pulse RF (that is, for example, −, or −180° instead of +, or +180°) as repetition intervals 140* or **150*, 160*. This procedure is also known as pairing. Here, due to the retention of the rephasers or of the phases of the spins assigned to the rephasers in the first, second and third slice in the transition from repetition interval 150 to repetition interval 150*, the phase of the excitation pulse RF being inverted, however, this leads to the generation of a counter-directional interference field that just compensates for the interference field generated in the repetition interval 150 or, expressed in more general terms, at least partly reduces it. The repetition interval 140 corresponds to the repetition interval 140 shown in FIG. 2. This is now repeated by the repetition interval 140*, the phase of the excitation pulse RF again being inverted, in order to compensate for the interference field generated in the repetition interval 140. The repetition interval 160 corresponds to the repetition interval 160 shown in FIG. 2. This is subsequently repeated immediately by the repetition interval 160*, the phase of the excitation pulse RF again being inverted in order to compensate for the interference field generated in the repetition interval 160. In the subsequent repetition intervals 150, 150*, 140, 140*, 160, 160* (not shown), the procedure of phase coding of the two simultaneously excited slices and of the said pairing is again repeated, but there are changes, for example, in the gradient pulses GR or GP, so that a different k-space line is now scanned. For the simultaneous excitation shown in FIG. 4 of three slices with the repetition intervals 140, 140*, 150, 150*, 160, 160***, the result is, for example, a sequence of the phases of the excited spins assigned to the prephasers of (0°, 0°, 120°, 120°, 240°, 240°).

An option for compensating for the time spent on pairing, that is for the repetition of the repetition intervals with the same rephaser, but with an inverted RF signal, is to change the gradient pulses GP and GR that are oriented perpendicular to the slice selection gradient during the respective repetition procedure 140*, 150*, 160*, such that during the repetition procedure, a k-space line that is different from the respective repetition intervals 140, 150 and 160 can be scanned. Consequently, the additional time spent on pairing can again be compensated, and the advantageous property of a short imaging time inherent in the TruFISP-CAIPIRINHA method can be achieved with an image quality that is clearly improved over the method shown in FIG. 1 and FIG. 2.

It is also possible in the respective additional repetition procedure to change the phase or the phase coding PE of the spins assigned to the respective slice slightly. This means that the rephaser is changed slightly in the repetition procedure 140*, 150*, 160* shown in FIGS. 3 and 4. For the simultaneous excitation of two slices shown in FIG. 3, the phase difference assigned to the consecutive rephasing gradient pulses is 180°. For a corresponding simultaneous excitation of two slices with the repetition intervals 140, 140*, 150, 150* shown in FIG. 3, the result is, for example, a sequence of the phases of the excited spins assigned to the prephasers of ($\delta_1$, $\delta_2$, 180°+$\delta_3$, 180°+$\delta_4$), where $|\delta_i| \ll 180°$. In this instance, the limiting case would be (0°, 90°, 180, 90°) and (0°, 90°, 180°, 270°).

For the simultaneous excitation of three slices with the repetition intervals 140, 140*, 150, 150*, 160, 160* shown in FIG. 4, the result is, for example, a sequence of the phases of the excited spins assigned to the prephasers of ($\delta_1$, $\delta_2$, 120°+$\delta_3$, 120°+$\delta_4$, 240°+$\delta_3$, 240°+$\delta_4$, where $|\delta_i| \ll 120°$. In this instance, the limiting case would be (0°, 60°, 120°, 180°, 240°, 300°).

FIG. 5 shows a magnetic resonance unit according to the invention or a magnetic resonance imaging system 1. It encompasses the actual magnetic resonance scanner 2 with a test chamber or patient tunnel 8 located therein. A bed 7 can be slid into this patient tunnel 8, such that, during an examination, an examination object O (patient/test subject) lying on it can be placed in a certain position within the magnetic resonance scanner 2 relative to the magnetic system and radio-frequency system or can be moved between different positions.

Basic components of the magnetic resonance (MR) scanner 2 are a basic field magnet 3, a gradient system 4 with gradient coils in order to apply any magnetic field gradients in the x-, y- and z-direction, in addition to a whole body radio-frequency coil 5. The reception of the magnetic resonance signals induced in the examination object O can be achieved via the whole body coil 5, with which the radio-frequency signals used to induce the magnetic resonance signals are usually transmitted. Generally, however, these signals are received, for example, using local coils 6, arranged on or below the examination object O. All these components are basically known to those skilled in the art and are therefore only shown in a rough diagram form in FIG. 5.

The whole body radio-frequency coil 5 may include, for example, a number N of individual antenna poles in the form of what is known as a birdcage antenna, said poles being controllable as individual channels S1, . . . , SN separate from a control device 10, that is, the magnetic resonance tomography system 1 is a pTX-capable system. Attention is expressly drawn, however, to the fact that the method according to the invention can also be used on conventional magnetic resonance tomography devices with only one transmission channel.

The control device 10 can be a control processor that can also consist of a number of individual computers—optionally also spatially separated and connected to each other by suitable bus systems or cables or suchlike. A terminal interface 17 connects this control device 10 to a terminal 20, via which an operator can control the entire unit 1. In the present case, this terminal 20 has a computer 21 with a keyboard 28, one or more screens 27, and further input devices, such as, for example, a mouse or the like, so that a graphic user interface is made available to the operator.

The control device 10 has among other things a gradient control unit 11, which can again composed of several sub-components. The individual gradient coils are connected via this gradient control unit 11 with control signals SGx, SGy, SGz. These are gradient pulses that are set during a measurement at precisely predetermined chronological positions and with a precisely predetermined time schedule, in order to scan the examination object O and k-space assigned thereto preferably in individual slices SL according to a control sequence AS.

The control device 10 additionally comprises a radio-frequency (RF) transmitting/receiving unit 12. This RF transmitting/receiving unit 12 likewise, is composed of several sub-components, to apply radio-frequency pulses in each case separately and in parallel to the individual transmission channels S1, . . . , SN, that is, in this case to the individual controllable antenna poles in the body coil 5. It is also possible for magnetic resonance signals to be received via the transmitting/receiving unit 12. In this embodiment, however, this is achieved with the use of the local coils 6. The raw data RD received by the local coils 6 is read out and processed by an RF receiving unit 13. The magnetic resonance signals received by the unit or by the whole body coil 5 by means of the transmitting/receiving unit 12 are forwarded as raw data RD to a reconstruction unit 14 which reconstructs the image data BD therefrom and stores this data in a memory 16 and/or forwards it via the interface 17 to the terminal 20, so that the operator can review it. The image data BD can also be stored and/or displayed and evaluated at other locations via a network NW. Insofar as the local coils 6 have a suitable switching unit, the coils can also be connected to an RF transmitting/receiving unit 12 in order to also use the local coils for transmission in pTX operation in particular.

The gradient control 11, the RF transmitting/receiving unit 12 and the receiving unit 13 for the local coils 6 are coordinated in each case by a measurement control unit 15. Using corresponding commands, this unit ensures that a desired gradient pulse train GP is transmitted by means of gradient control signals SGx, SGy, SGz, and in parallel it controls the RF transmitting/receiving unit 12 such that a multichannel pulse train MP is transmitted, that is, such that, on the individual transmission channels S1, . . . SN, the matching radio-frequency pulses are sent in parallel to the individual transmission poles in the whole body coil 5. In addition it has to be ensured that, at the appropriate time, the magnetic resonance signals on the local coils 6 are read out and further processed by the RF receiving unit 13 or any potential signals on the whole body coil 5 are read out and further processed by the RF transmitting/receiving unit 12. The measurement control unit 15 transmits the corresponding signals, in particular the multichannel pulse train MP, to the radio-frequency transmitting/receiving unit 12 and the gradient pulse train GP to the gradient control unit 11, according to a predetermined control protocol P. Stored in this control protocol P are all the control data that has to be adjusted during a measurement according to a predetermined control sequence AS.

A number of control protocols P for various measurements are generally stored in a memory 16. These could be selected by the operator via the terminal 20 and optionally varied in order to then have available a suitable control protocol P for the measurement that is currently required, with which protocol the measurement control unit 15 can work. Moreover, the operator can also access control protocols P from a manufacturer of the magnetic resonance system, for example, via a network NW and then optionally modify and use them.

The basic procedure for such a magnetic resonance measurement and the aforementioned components for the control thereof are known to a person skilled in the art, and thus need not be explained in detail herein. Moreover, such a magnetic resonance scanner 2 and also the control device pertaining thereto may also have a number of further components, which likewise are not explained in detail here. The magnetic resonance scanner 2 can also be constructed in a different manner, for example, with a patient chamber that is open at the side, and the radio-frequency whole body coil does not have to be designed as a birdcage antenna.

FIG. 5 additionally shows in a block diagram a control sequence determination device 22 according to the invention, which serves to determine a magnetic resonance system control sequence AS. This magnetic resonance system control sequence AS contains, among other things for a specific measurement, a pulse sequence, the sequence including a pulse train GP, in order to run though a specific trajectory in k-space, and also a radio-frequency pulse train coordinated therewith, in this case a multi-channel pulse train MP, to control the individual transmission channels 1, . . . , SN. The magnetic resonance system control sequence AS is established in the present case on the basis of predetermined parameters PD in the test protocol P, in particular according to a method described with reference to FIG. 3 or 4. The control sequence determination device 22 can be included in the magnetic resonance system 1 as shown, and in particular can also be a component of the control device 10. It is also conceivable, however, for the control sequence determination device 22 to be provided externally as a stand-alone unit and it is designed to be used with a plurality of different magnetic resonance systems.

From the aforementioned description it is clear that the invention effectively provides possibilities for improving a method for the control of a magnetic resonance imaging system for the generation of magnetic resonance image data with respect to the image quality of the image data.

It is pointed out, however, that the features of all the embodiments or of further developments disclosed in the drawing can be used in any combination.

Although modifications and changes may be suggested by those skilled in the art, it is the intention of the inventor to embody within the patent warranted hereon all changes and modifications as reasonably and properly come within the scope of his contribution to the art.

I claim as my Invention:

1. A method for acquiring magnetic resonance image data from an examination subject, comprising:

from a control computer, operating a magnetic resonance data acquisition unit, while an examination subject is situated therein, said examination unit comprising gradient coils and at least one radio-frequency (RF) antenna, with a pulse sequence comprising a plurality of pulse sequence segments, each pulse sequence segment comprising an excitation procedure and a subsequent readout procedure;

from said control computer, in each excitation procedure, operating said gradient coils to generate a first slice selection gradient pulse in a slice selection direction and operating said at least one RF antenna to generate an RE excitation pulse comprising N excitation frequencies that simultaneously excite N slices of said examination subject;

from said control computer, in each readout procedure, operating said gradient coils to generate a rephasing pulse in said slice selection direction and operating said at least one RE antenna to receive RF signals comprising magnetic resonance raw data;

from said control computer, after receiving said RF signals for a respective pulse sequence segment, and before generating the RF excitation pulse in a pulse sequence segment that immediately follows said respective pulse sequence segment, operating said gradient coils to generate a prephasing gradient pulse in said slice selection direction, and configuring said prephasing gradient pulse to make a zeroth gradient moment thereof, which is integrated over all of said gradient pulses in said slice selection direction, from a center of said RF excitation pulse in said respective pulse sequence segment to a center of said RF excitation pulse in said immediately following pulse sequence segment, have a value of zero;

from said control computer, for each of said N slices that are simultaneously excited, repeating said pulse sequence segment, as a plurality of immediately subsequent pulse sequence segment pairs with the rephasing gradient pulse differing from pair-to-pair, and within each pair, generating said respective rephasing pulses as similar rephasing pulses that differ from each other by less than 180°, and generating respective RF excitation pulses with different phases; and from said control computer, entering said raw magnetic resonance data for each slice into a memory organized as k-space, and making the data entered into k-space available at an output of said control computer in electronic form as a data file for further processing.

2. A method as claimed in claim 1 comprising generating said similar rephasing gradient pulses in each pair of pulse sequence segments as equal rephasing gradient pulses.

3. A method as claimed in claim 1 comprising operating said gradient coils to generate a gradient pulse in a plane that is transverse to said slice selection direction simultaneously with said rephasing gradient pulse, and generating said gradient pulse in said plane that is transverse to said slice selection direction as a balanced gradient pulse.

4. A method as claimed in claim 1 comprising, in each pair of pulse sequence segments, operating said gradient coils to generate different gradient pulses in a plane that is transverse to said slice selection direction, and generating each of said different gradient pulses as a balanced gradient pulse.

5. A method as claimed in claim 1 comprising entering said raw magnetic resonance data into said memory organized as k-space by undersampling k-space.

6. A method as claimed in claim 1 comprising entering said magnetic resonance raw data into said memory organized as k-space by Cartesian sampling of k-space.

7. A method as claimed in claim 1 comprising entering said magnetic resonance raw data into said memory organized as k-space by radial sampling of k-space.

8. A method as claimed in claim 1 comprising entering said magnetic resonance raw data into said memory organized as k-space by randomly controlled sampling of k-space.

9. A method as claimed in claim 1 comprising operating said magnetic resonance data acquisition unit according to said pulse sequence for sine acquisition of said magnetic resonance raw data.

10. A method as claimed in claim 1 wherein N=2.

11. A method as claimed in claim 1 wherein N=3.

12. A magnetic resonance apparatus comprising:
a magnetic resonance data acquisition unit comprising gradient coils and at least one radio-frequency (RF) antenna;
a control computer configured to operate the magnetic resonance data acquisition unit, while an examination subject is situated therein, with a pulse sequence comprising a plurality of pulse sequence segments, each pulse sequence segment comprising an excitation procedure and a subsequent readout procedure;
said control computer being configured, in each excitation procedure, to operate said gradient coils to generate a first slice selection gradient pulse in a slice selection direction and to operate said at least one RF antenna to generate an RF excitation pulse comprising N excitation frequencies that simultaneously excite N slices of said examination subject;
said control computer being configured, in each readout procedure, to operate said gradient coils to generate a rephasing pulse in said slice selection direction and to operate said at least one RF antenna to receive RF signals comprising magnetic resonance raw data;
said control computer being configured, after receiving said RF signals for a respective pulse sequence segment, and before generating the RF excitation pulse in a pulse sequence segment that immediately follows said respective pulse sequence segment, operate said gradient coils to generate a prephasing gradient pulse in said slice selection direction, and to configure said prephasing gradient pulse to make a zeroth gradient moment thereof, which is integrated over all of said gradient pulses in said slice selection direction, from a center of said RF excitation pulse in said respective pulse sequence segment to a center of said RF excitation pulse in said immediately following pulse sequence segment, have a value of zero;
said control computer being configured, for each of said N slices that are simultaneously excited, to repeat said pulse sequence segment, as a plurality of immediately subsequent pulse sequence segment pairs with the rephasing gradient pulse differing from pair-to-pair, and within each pair, to generate said respective rephasing pulses as similar rephasing pulses that differ from each other by less than 180°, and to generate respective RF excitation pulses with different phases; and
said control computer being configured to enter said raw magnetic resonance data for each slice into a memory organized as k-space, and to make the data entered into k-space available at an output of said control computer in electronic form as a data file for further processing.

13. A non-transitory, computer-readable data storage medium encoded with programming instructions, said data storage medium being loaded into a control computer of a magnetic resonance apparatus that comprises a magnetic resonance data acquisition unit comprising gradient coils and at least one radio-frequency (RF) antenna, said programming instructions causing said control computer to:
operate the magnetic resonance data acquisition unit, while an examination subject is situated therein, with a pulse sequence comprising a plurality of pulse sequence segments, each pulse sequence segment comprising an excitation procedure and a subsequent readout procedure;
in each excitation procedure, operate said gradient coils to generate a first slice selection gradient pulse in a slice selection direction and operate said at least one RF antenna to generate an RF excitation pulse comprising N excitation frequencies that simultaneously excite N slices of said examination subject;
in each readout procedure, operate said gradient coils to generate a rephasing pulse in said slice selection direction and operate said at least one RF antenna to receive RF signals comprising magnetic resonance raw data;
after receiving said RF signals for a respective pulse sequence segment, and before generating the RF excitation pulse in a pulse sequence segment that immediately follows said respective pulse sequence segment, operate said gradient coils to generate a prephasing gradient pulse in said slice selection direction, and configure said prephasing gradient pulse to make a zeroth gradient moment thereof, which is integrated over all of said gradient pulses in said slice selection direction, from a center of said RF excitation pulse in said respective pulse sequence segment to a center of said RF excitation pulse in said immediately following pulse sequence segment, have a value of zero;
for each of said N slices that are simultaneously excited, repeat said pulse sequence segment, as a plurality of immediately subsequent pulse sequence segment pairs with the rephasing gradient pulse differing from pair-to-pair, and within each pair, generate said respective rephasing pulses as similar rephasing pulses that differ from each other by less than 180°, and generate respective RF excitation pulses with different phases; and
enter said raw magnetic resonance data for each slice into a memory organized as k-space, and make the data entered into k-space available at an output of said control computer in electronic form as a data file for further processing.

* * * * *